United States Patent [19]

Krummer

[11] Patent Number: 4,950,922
[45] Date of Patent: Aug. 21, 1990

[54] ELECTRICAL SWITCH

[75] Inventor: Thomas Krummer, Weissenburg, Fed. Rep. of Germany

[73] Assignee: Diehl GmbH & Co., Nuremberg, Fed. Rep. of Germany

[21] Appl. No.: 300,343

[22] Filed: Jan. 20, 1989

[30] Foreign Application Priority Data

Feb. 4, 1988 [DE] Fed. Rep. of Germany ....... 3803284

[51] Int. Cl.$^5$ ..................... H03K 17/97; H03K 17/90
[52] U.S. Cl. ............................. 307/309; 324/117 H; 324/529
[58] Field of Search ............................... 307/309, 353; 324/158 R, 202, 234, 251, 258, 259, 529, 117 H; 200/19 M, 341

[56] References Cited

U.S. PATENT DOCUMENTS

| 3,596,114 | 7/1971 | Maupin et al. | 307/309 |
| 4,218,626 | 8/1980 | Fukuda et al. | 307/309 |
| 4,374,333 | 2/1983 | Avery | 307/309 |
| 4,514,687 | 4/1985 | Van Husen | 324/202 |

FOREIGN PATENT DOCUMENTS

| 1939642 | 1/1975 | Fed. Rep. of Germany. |
| 2335907 | 1/1975 | Fed. Rep. of Germany. |
| 0147178 | 3/1981 | Fed. Rep. of Germany ...... 307/309 |

Primary Examiner—John Zazworsky
Attorney, Agent, or Firm—Scully, Scott, Murphy & Presser

[57] ABSTRACT

An electrical switch incorporating a pushbutton, which is actuatable in opposition to the biasing action of a spring. A permanent magnet is provided in the switch housing as an axial extension of the pushbutton; having a coil arranged opposite thereof which has its distal end surface contacting against an acoustic sensor which is in connection with the contact pins. Hereby, a switching pusher can axially connect with the pushbutton which projects from the housing, at the end of which pusher there is mounted a permanent magnet interiorly of the housing, which is arranged at an axial spacing with regard to the facing end surface of the coil in the unactuated condition of the switch, and in the presence of a depressed pushbutton, is arranged with only a narrow gap axially in front of the coil core.

7 Claims, 2 Drawing Sheets

ELECTRICAL SWITCH

BACKGROUND OF THE INVENTION

1. Field of the Invention

The present invention relates to an electrical switch incorporating a pushbutton, which is actuatable in opposition to the biasing action of a spring.

2. Discussion of the Prior Art

Electrical switches of the above-mentioned type are, in general, known in the technology. In essence, German Published Patent Appln. No. 19 39 672 discloses a switch which is predicated on the imposition of a linear pressure for effectuating a non-clicking switching function, and incorporating a pushbutton which is axially actuatable in opposition to the action of inserted springs.

Another switch of the type which is under consideration herein has become known from the disclosure of German Laid-Open Patent Appln. No. 23 35 907 wherein, again, a touch control or pushbutton for the generation of electrical signals is axially actuatable in opposition to the action of springs. As soon as the pressure has been released on the touch control or the pushbutton provided in these switches, the pushbutton springs back into its initial position in response to the spring forces exerted thereon. As a result thereof, there is concurrently interrupted the electrical contact between the fixed contact pins.

These above-described switches are, in all aspects, mechanically-contacting switches which can be employed for only certain instances of utilization in which there are required relatively close switching tolerances.

However, for particular instances of application; for example, such as for the carrying out of control functions in the operation of air-craft, it is necessary to provide switches which allow for an almost unlimited number of switching cycles and thereby possess a high degree of operational reliability.

SUMMARY OF THE INVENTION

Accordingly, it is an object of the present invention to provide an electrical switch of the above-mentioned type which operates in a non-contacting mode, which with reliability affords for an almost unlimited number of switching cycles and which is continually testable through the intermediary of an evaluating (sample-and-hold) electronic circuit.

This object is inventively attained in that a permanent magnet is provided in the switch housing as an axial extension of the pushbutton; having a coil arranged opposite thereof which has its distal end surface contacting against a Hall sensor which is in connection with contact pins. Hereby, in a specific configuration of the invention, a switching pusher can axially connect with the pushbutton which projects from the housing, at the end of which pusher there is mounted a permanent magnet interiorly of the housing, which is arranged at an axial spacing with regard to the facing end surface of the coil in the unactuated condition of the switch, and in the presence of a depressed pushbutton, is arranged with only a narrow gap axially in front of the coil core.

In this inventive switch, the pushbutton can possess an inwardly located shoulder, whereby the shoulder is provided with a radial blind-bore into which there is inserted a spring-supported latching ball, the latter of which contacts against the inner circumferential surface of the housing cavity and, upon the pushbutton being depressed, lies within an annular groove in the housing cavity after overcoming a protrusion in the housing cavity. The overcoming of the protrusion in the housing wall structure advantageously leads to the formation of a necessary switching pressure-point. After the rise to this pressure point, under a further axial pressure the ball drops thereafter into the annular groove, which leads immediately to a feelable or sensible reduction in the resistance to pressure.

The dimensioning of the coil pursuant to the invention can be made in conformance with the requirements that its magnetic flux is essentially greater than the magnetic flux of the permanent magnet.

The Hall sensor can possess an integrated evaluating (sample-and-hold) electronics, which is formed from the series-connected components constituted of a Hall element, linear amplifier, Schmitt-trigger and switching transistor, and which have a voltage regulator operatively associated therewith.

Pursuant to a preferred embodiment, in at least in the region of the Hall sensor with the coil and permanent magnet, the switch housing is constituted from a ferromagnetic material.

One or more of these electrical switches are connectable as a testable sensor-pushbutton switch with an evaluating unit for the purpose of functional testing in the switched-off as well as in the switched-in condition. Furthermore, in the case of a necessary serialized data transmission, a plurality of sensor switches are connectable in a matrix.

Such an electrical switch possesses, foremost, an advantageous setting or adjusting characteristic which, above all, is of expedient significance for this non-contacting switch in its utilization in aircraft equipment. Through the intermediary of this setting characteristic, the pressure point can be rendered feelable or perceptible, and there is avoided any unintended triggering caused by accidental touching. However, at the same time, there is also afforded the reconveyance of the setting components into the zero or neutral position.

A further particular advantage of this electrical switch resides in the combination of the contactless switch elements with the setting characteristic and the setting forces of switches of mechanical types of construction. Through the utilization of a Hall sensor with an integrated evaluating electronics it is possible to provide an almost unlimited number of switching cycles, whereby there can be readily ascertained the switching direction. It is also possible to attain extremely slow switching sequences and, in the same manner, highly frequent switching cycles. The necessary ability to be able to test this electrical switch is afforded by means of the coil. As a result thereof, there can be carried out a functional testing of the sensor in the switched-off condition with regard to a possible unloaded operating behavior, as well as in the switched-on condition to be able to ascertain, through the negative coil current, any short-circuit condition of the sensor. The electrical switch and the signal lines are continually testable with only a limited demand thereon. A signal emission is always effected only subsequent to a testing.

The electrical switch; in essence, consists of a total of three structural units: i.e. functional component-setting characteristic, functional component-excitation and connections.

Through the size of the coil there is effectuated that the magnetic flux of the coil is essentially greater than that of the magnetic flux of the permanent magnet, the magnetic flux field of the coil resultingly acts in opposition to that of the permanent magnet in the switched-in condition of the switch, and for a short period of time reactivates the Hall sensor.

Only after a numerously implemented successful functional testing within less than 0.5 milliseconds, is the actual switching signal generated by the evaluating electronics. Hereby, inasmuch as all components which are necessary for the sensing are encapsulated in a ferromagnetic housing constitued of an MU metal, there are expediently screened off any small and intermediate leakage fields. Furthermore, for the maintaining of the function of the sensor at a stimulation with the permanent magnet there is closed the magnetic flux through the switch housing.

BRIEF DESCRIPTION OF THE DRAWINGS

Further details and advantageous features may now be readily ascertained from the following detailed description, taken in conjunction with the accompanying drawings, in which.

DETAILED DESCRIPTION

Figure 1:
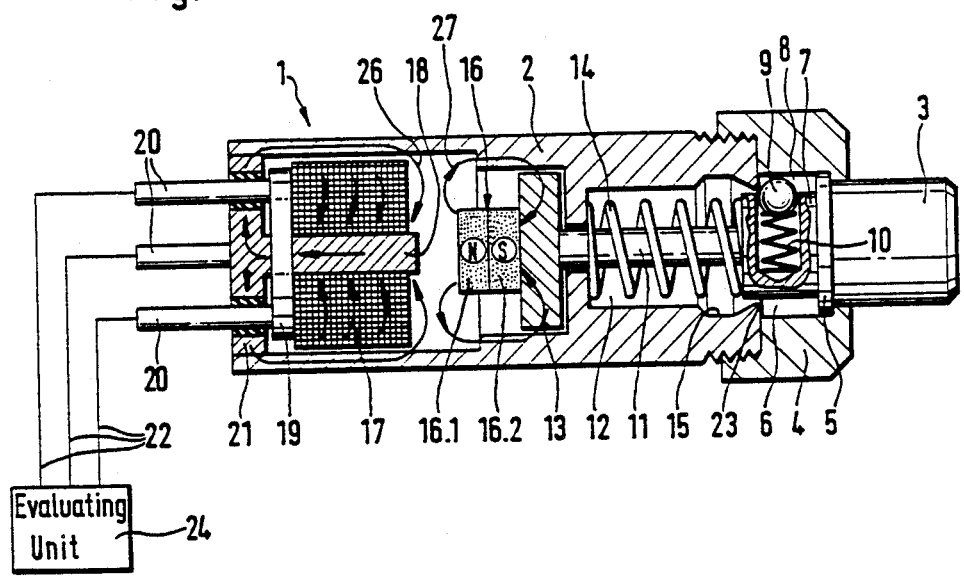
FIG. 1 illustrates a longitudinal sectional view through the electrical switch pursuant to the invention.

The electrical switch 1 is essentially constituted of the three component units; such as
  Functional component-setting characteristic
  Functional component-part-excitation
  Connections.

All essential components are arranged in a switch housing 2 which is constituted from a ferromagnetic material. On the operating side, a pushbutton 3 protrudes outwardly from cover 4 of the housing 2. Hereby, the pushbutton 3 includes a collar 5 which contacts against a shoulder of the cover recess 6. An axial extension of the pushbutton 3 is formed by a wide shoulder 7 which possesses a radial blind bore 8 into which there is introduced a ball 9 with a pressure spring 10. A switching pusher 11 protrudes as an axial extension of the pushbutton 3 through the stepped cavity 12 of the switch housing 2, and is equipped with a disc 13 at its axial end. Extending about the switching pusher 11 is a pressure spring 14 which serves as a resetting spring for the pushbutton 3, and which, at one end, supports itself at the shoulder 7, and at the other end, against an axial housing wall of the cavity 12. The cavity 12 of the switch housing 2 possesses an encompassing annular groove 15 in its upper region, which extends conically towards the end surface of the switch housing 2.

The functional component for the setting characteristic consists of the pushbutton 3 with the shoulder 7, the switching pusher 11, the pressure spring 14 and the spring-supported ball 9 within the upper portion of the switch housing 2.

Arranged on the disc 13, in an axial extension, is a permanent magnet 16 with its north polarity 16.1 and its south polarity 16.2. At an axial spacing relative to the north polarity 16.1 of the permanent magnet 16, in the switched-off condition of the electrical switch 1, there is located a coil 17 extending about the coil core 18. The coil 17 contacts axially against the Hall sensor 19 which, in turn, is in electrical connection with the contact pins 20. The contact pins 20 project outwardly through openings provided in the base 21 of the switch housing. The coil 17 and the acoustic sensor are connectable by means of five electrical lines 22 with an evaluating unit 24.

The functional component "excitation", pursuant to the constructive arrangement of electric switch 1, is constituted from the disc 13, the permanent magnet 16, the coil 17 and the Hall sensor 19.

Finally, the function component "connection" is formed by the contact pins 20 of the electrical switch 1.

Figure 2:
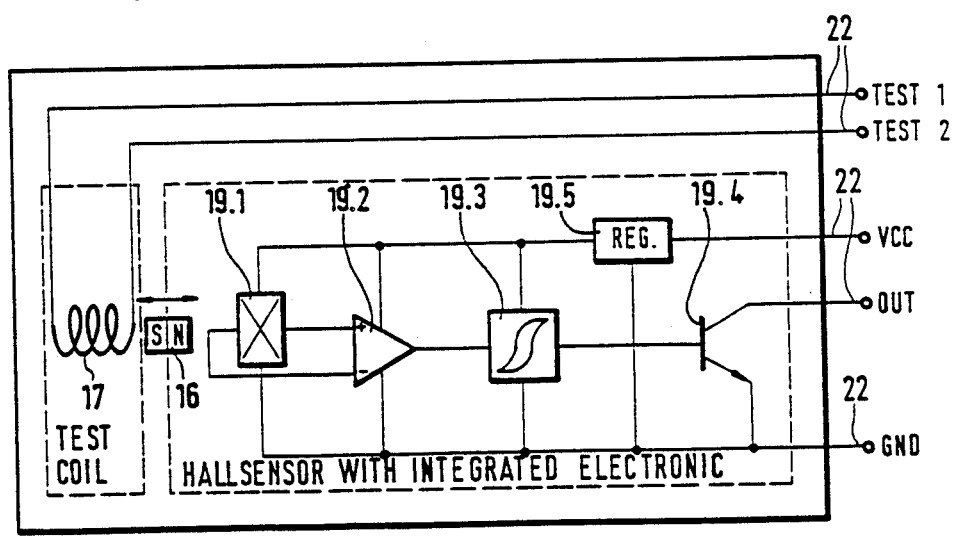
FIG. 2 illustrates a block circuit diagram of the electronics which are integrated in the Hall sensor.

As can be ascertained from the block circuit diagram of FIG. 2, the Hall sensor 19 possesses an integrated electronic circuit which is constituted from a Hall element 19.1, a linear amplifier 19.2, a Schmitt-trigger 19.3 and a transistor switch 19.4, all of which are connected in series. An inserted voltage regulator 19.5 serves to provide for a continually uniform voltage level.

Through the configuration of the electrical switch which is represented in FIG. 1, the latter can be tested by means of the inserted coil 17 with regard to the orderly functioning in each operating position; namely, in the switched-in and in the switched-off condition. Hereby, the operational testing of the Hall sensor 19 directs itself in the switched-off condition of the pressure switch 1, at a positive coil current, to a possible unloaded condition for the Hall sensor 19. In contrast therewith, in the switched-in condition, by means of the then negative coil current, there is inhibited any release of a signal at an eventual short circuited condition of the Hall sensor 19. The electrical switch and the signal lines are hereby continually testable with only a limited demand thereon. A signal release for a switched-in switch 1 is effected only after the completed operational testing.

The sizing of the coil 17 is implemented under the requirement that the magnetic flux of the coil 17 be substantially greater than that of the magnetic flux of the permanent magnet 16. In the switched-in condition of the electrical switch 1, the magnetic field of the coil 17 acts in opposition to the magnetic field of the permanent magnet, and reactivates the Hall sensor 19 for a short period of time. Only after a repeatedly completed operational or functional test is there externally generated the actual switching signal by the evaluating electronics.

The opposing field from the coil 17 due to its suitable dimensioning, does not lead to any demagnetizing of the permanent magnet 16. All of the components of the electric switch 1 which are necessary for sensing are encapsulated in a ferromagnetic housing 2; for example, constituted of a MU metal. Small and intermediate leakage fields are screened off by this special material. Moreover, there is placed in readiness a high permeability and a low coercive force by this material, such that upon stimulation with the permanent magnet 16, the magnetic flux can be closed across the housing 2.

Figure 5:
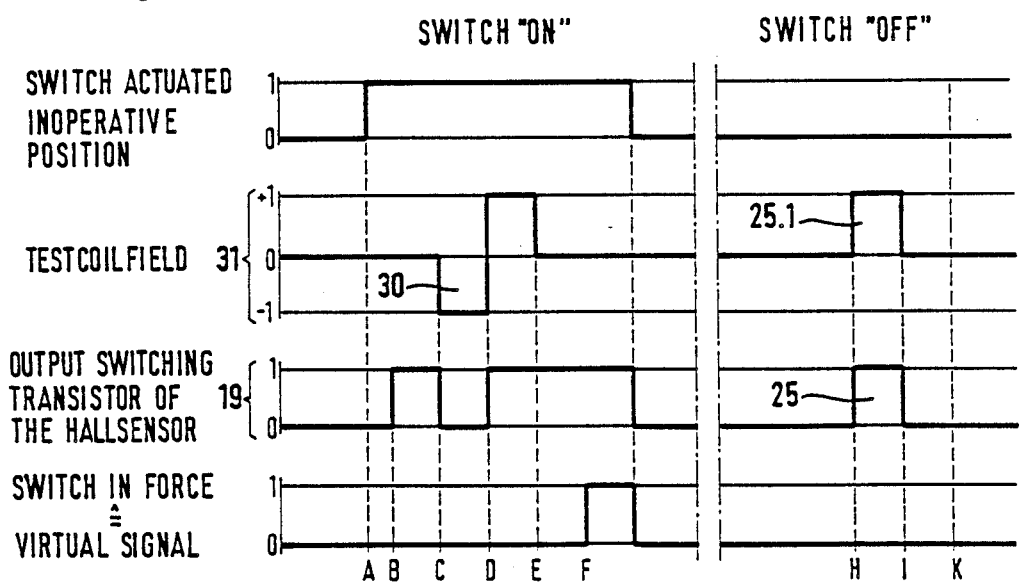
FIG. 5 illustrates a time plot for the switch test.

The testing phase for the electrical switch 1 in the switched-off condition pursuant to FIG. 1 is effectuated in that an evaluating unit 24 which is connected to the coil 17 initially tests the data line and the Hall sensor 19 at the point in time H pursuant to FIG. 5, and thereby supplies the coil with a positive constant current for a short period of time. This current thusly builds up a magnetic field in the electrical switch 1 through the coil 17, which excites the switching transistor 19.4 in the Hall sensor 19. At a proper functioning of the Hall sensor 19, the data line is switched to "logic 1". As can be ascertained from the test coil field in FIG. 5 with regard to the condition of the switched-off switch 1, there is thereby effected a short jump in the form of a square-wave signal 25, which is interrogated by the evaluating unit 24 which after a short calming phase will test the data line as to the condition "logic 0" at the point in time K in FIG. 5. At an unloaded behavior of the Hall sensor 19 or an interruption of the data line, this test phase will in overall, not take place correctly. This erroneous through-run is then recognized by the evaluating unit 24 as a malfunction error and conveyed to the operating personnel.

In the switched-off condition of the electrical switch 1 there is; in effect, present a coil current with a positive square-wave signal 25, which is equalized to 0 (zero) at a malfunction in the unloaded condition. During this described testing phase for the electrical switch 1, the coil 17 builds up a magnetic field which is represented by the arrows 26 in FIG. 1. The magnetic field of the permanent magnet is elucidated by the arrows 27.

The description of the operation of the switch test for the electrical switch 1 in the switched-on condition is hereinbelow on the basis of the illustrations in FIGS. 3 and 4.

Figure 3:
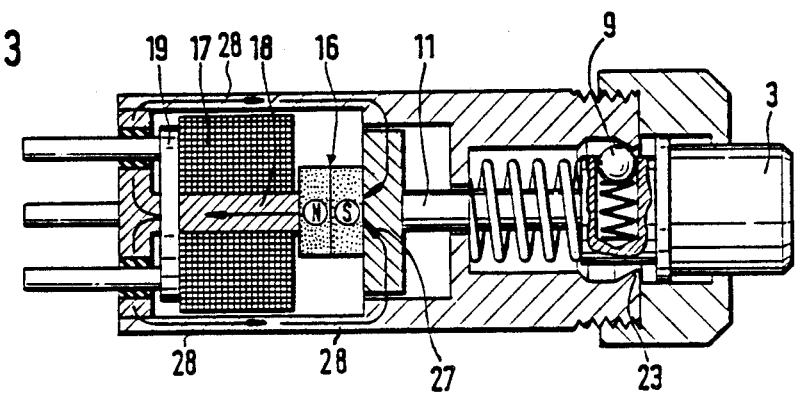
FIG. 3 illustrates the electrical switch pursuant to FIG. 1 in the switched-in condition thereof, with stimulation of the sensor.
Figure 4:
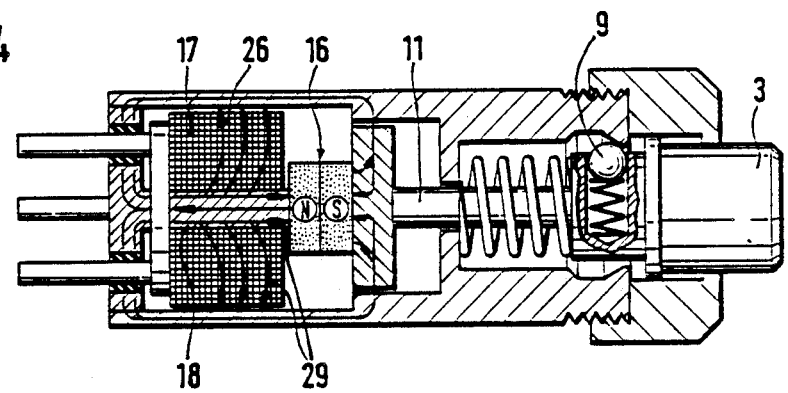
FIG. 4 illustrates a sectional view of the electrical switch pursuant to FIG. 1 with simulation of the sensor and the testing of the sensor through the coil.

As can be ascertained from these FIGS. 3 and 4, the pushbutton 3 has currently been depressed, whereby the ball 9 after a clearly sensible passage over the edge 23 lies in the annular groove 15 within the cavity 12 of the switch housing 2. The permanent magnet 16 has been displaced by the switching pusher 11 towards the facing end surface of the coil core 18, without coming into contact with the coil core 18. A relatively narrow gap is formed between the coil core 18 and the permanent magnet 16 in this condition of the switch.

In FIG. 3 there is initially provided the stimulation of the Hall sensor 19 only by means of the permanent magnet 16. The hereby flowing currents are illustrated through the arrows 28.

In contrast therewith, in FIG. 4, in addition to the stimulation of the Hall sensor 19 by the permanent magnet 16, there is also represented that the coil 17 tests the Hall sensor. The total currents which flow during this sequence, and the building up magnetic fields are represented by the arrows 29.

The description of the operation is now also elucidated hereinbelow with consideration given to FIG. 5 for the condition of the switched-on switch 1. Upon the actuation of the electrical switch 1 by means of the pushbutton 3, there is activated the output of the Hall sensor 19 at the point in time A in FIG. 5, and the switching transistor is connected through at the point in time B. The actual test phase is initiated at the point in time C in FIG. 5. The evaluating unit 24 activates the coil 17, and the negative constant current pursuant to the square-wave signal 30 in the test coil field 31 generates a magnetic field by means of the coil 17 in the electrical switch 1, which field is directed in opposition to the magnetic field of the permanent magnet 16. The resulting overall magnetic field becomes equal to or less than zero, and leads to the condition in which the switching transistor 19.4 blocks the Hall sensor 19.

In the case of malfunctioning of the electrical switch 1, the data line will maintain this high-level. The absence of a jump is recognized by the evaluating unit 24 and considered as a malfunction. Such a malfunction; for instance, can signify an interruption or break in the coil line or, possibly, a transistor collector-emitter section closure or short-circuit of the data line.

When, during this test phase, there are thereafter reversed the polarities of the groups of test coils, then at the point in time D in FIG. 5, there is again rapidly built up the magnetic flux of the permanent magnet 16. The switching transistor 19.4 will become transmissive and the data line is, as a result, switched to the condition "logic 1". Thereafter, the evaluating unit 24 will also switch the coil 17 to a currentless state.

Only when the entire testing cycle has been properly completed will the evaluating unit 24 recognize the switching signal as being valid at the point in time F in FIG. 5. The virtual signal for the valid switch is generated by the evaluating unit 24.

The negative signal 30 in the test coil field 30 stands for the testing with respect to the short-circuit condition, whereas the positive square-wave signal 25.1 signifies the test run with regard to the sequence behavior.

What is claimed is:

1. Electrical switch comprising: a housing; a pushbutton protruding from said housing at a first end of said housing; a spring in said switch, said pushbutton being actuatable opposite the biasing action of said spring; a permanent magnet arranged as an axial extension of said pushbutton within said housing; a coil positioned in said housing at a second end of said housing, said coil having a first end surface facing said permanent magnet; and a Hall sensor being contacted by a second end surface of said coil opposite to said first end surface, said sensor being in electrical connection with contact pins.

2. Electrical switch as claimed in claim 1, wherein the pushbutton has a switching pusher axially connected thereto within said housing, said permanent magnet being mounted at the end of said pusher in the interior of the housing, said permanent magnet being arranged at an axial spacing from the first end surface of said coil in the unactuated condition of said switch, and at the pushbutton being depressed being at a close axial spacing from a core of said coil.

3. Electrical switch as claimed in claim 1, wherein said pushbutton includes a shoulder extending inwardly of said housing; a radial blind-bore in said shoulder, a spring-supported latching ball being located in said blind-bore, said ball contacting against the inner mantle surface of cavity of said housing, and upon said pushbutton being depressed, after overcoming a protrusion on the inner mantle wall of said housing, engaging into an annular groove located in the housing cavity.

4. Electrical switch as claimed in claim 1, wherein the sizing of the coil is predicated on the requirement that the magnetic flux thereof is essentially greater than the magnetic flux of the permanent magnet.

5. Electrical switch as claimed in claim 1, wherein said sensor includes an integrated electronic circuit comprising a Hall element, linear amplifier, Schmitt-trigger and switching transistor all electrically connected in series; and a voltage regulator operatively connected therewith.

6. Electrical switch as claimed in claim 1, wherein said switch housing in at least in a region containing the sensor with the coil and permanent magnet is constituted from a ferromagnetic material.

7. Electrical switch as claimed in claim 1, wherein said switch is a testable sensor-pushbutton switch which is connectable with an evaluating circuit for implementing functional testing of said switch in both switched-off and switched-on conditions thereof.

* * * * *